United States Patent
Rivers, Jr.

(10) Patent No.: US 9,455,564 B2
(45) Date of Patent: Sep. 27, 2016

(54) CURRENT AND VOLTAGE MODULE AND METHODS OF MONITORING CURRENT AND VOLTAGE IN POWER DISTRIBUTION SYSTEMS

(71) Applicant: General Electric Company, Schenectady, NY (US)

(72) Inventor: Cecil Rivers, Jr., Plainville, CT (US)

(73) Assignee: General Electric Company, Schenectady, NY (US)

( * ) Notice: Subject to any disclaimer, the term of this patent is extended or adjusted under 35 U.S.C. 154(b) by 293 days.

(21) Appl. No.: 14/186,567

(22) Filed: Feb. 21, 2014

(65) Prior Publication Data
US 2015/0244163 A1 Aug. 27, 2015

(51) Int. Cl.
G01R 19/00 (2006.01)
H02H 3/08 (2006.01)
G01R 1/20 (2006.01)
G01R 1/22 (2006.01)
(Continued)

(52) U.S. Cl.
CPC .................. H02H 3/08 (2013.01); G01R 1/20 (2013.01); G01R 1/22 (2013.01); G01R 15/142 (2013.01); G01R 19/00 (2013.01); H02B 1/26 (2013.01); H02H 3/20 (2013.01); H02H 3/42 (2013.01); G01R 11/06 (2013.01); G01R 15/183 (2013.01); G01R 19/20 (2013.01)

(58) Field of Classification Search
CPC .......... G01R 19/0092; G01R 19/0084; G01R 21/00; G01R 19/00; G01R 19/165; G01R 1/20; G01R 1/22; G01R 11/06; G01R 19/20; G01R 33/0283
USPC ......... 324/76.11–76.83, 117 R; 361/1, 6, 21, 361/32, 50, 56, 86, 88
See application file for complete search history.

(56) References Cited

U.S. PATENT DOCUMENTS 4,181,389 A 1/1980 Kiesel et al.
5,640,154 A 6/1997 Meyer et al.
(Continued)

FOREIGN PATENT DOCUMENTS

WO 9942845 A1 8/1999

OTHER PUBLICATIONS

Birtwhistle et al.,"A new technique for condition monitoring of MV metalclad switchgear", Trends in Distribution Switchgear: 400V-145kV for Utilities and Private Networks, 1998. Fifth International Conference on (Conf. Publ. No. 459), Issue Date—Nov. 10-12, 1998, pp. 91-95, ISSN : 0537-9989.

*Primary Examiner* — Son Le
*Assistant Examiner* — Raul Rios Russo
(74) *Attorney, Agent, or Firm* — General Electric Company

(57) ABSTRACT

A current and voltage module is provided that includes a housing having an opening extending at least partially therethrough in an axial direction. The housing is configured to receive a conductor within the opening. The module also includes a threaded metal insert extending radially through the housing and configured to align with a threaded opening defined in the conductor. The module further includes a fastening device configured to be inserted within the threaded metal insert and into the threaded opening to electrically couple the housing to the conductor. A voltage sensor is coupled to the threaded metal insert within the housing and is configured to sense an amount of voltage in the conductor. The module also includes a current sensor within the housing configured to sense an amount of current flowing in the conductor.

20 Claims, 3 Drawing Sheets

(51) Int. Cl.
  *H02B 1/26* (2006.01)
  *H02H 3/20* (2006.01)
  *G01R 15/14* (2006.01)
  *H02H 3/42* (2006.01)
  *G01R 15/18* (2006.01)
  *G01R 15/20* (2006.01)
  *G01R 19/20* (2006.01)
  *G01R 11/06* (2006.01)

(56) References Cited

U.S. PATENT DOCUMENTS

| | | | |
|---|---|---|---|
| 6,433,557 B1 | 8/2002 | Rashkes et al. | |
| 6,717,395 B2 | 4/2004 | Skendzic et al. | |
| 7,126,348 B2 | 10/2006 | Adolfsson et al. | |
| 7,714,566 B2 | 5/2010 | Perez | |
| 7,928,722 B2 | 4/2011 | Wallis | |
| 2009/0184787 A1* | 7/2009 | Weeks | H01H 71/02 335/18 |
| 2011/0242711 A1* | 10/2011 | Morgan | H01H 83/144 361/42 |
| 2012/0049839 A1 | 3/2012 | Kiendl | |
| 2012/0169323 A1* | 7/2012 | Ge | H02M 7/068 324/107 |
| 2013/0241532 A1* | 9/2013 | Voisine | G01R 11/17 324/110 |
| 2013/0300566 A1* | 11/2013 | Kumfer | H02H 5/12 340/686.6 |

\* cited by examiner

CURRENT AND VOLTAGE MODULE AND METHODS OF MONITORING CURRENT AND VOLTAGE IN POWER DISTRIBUTION SYSTEMS

BACKGROUND OF THE INVENTION

The present application relates generally to power distribution systems and, more particularly, to a current and voltage module and methods of monitoring current and voltage in power distribution systems.

Known electrical distribution systems include one or more circuit breakers that are each coupled to one or more loads. The circuit breakers are controlled based upon current flowing through the circuit breakers sensed by current sensors. For example, the circuit breaker causes current flow to be interrupted if the current is outside of acceptable operating conditions.

In addition to measuring current, at least some known circuit breakers also measure voltage. Voltage may be measured either as an amount between phase conductors and/or as an amount being applied to a load. The voltage measurement may be used for metering and/or protection purposes. To obtain a voltage measurement, some known circuit breakers include metal contacts, or taps, molded in a housing of the circuit breaker to tap off voltage. A hard wire connection is made from the taps to a circuit breaker trip unit. However, such taps may interfere with the circuit breaker's internal conductors, which may cause the connection with the conductors to weaken and/or fail over time. Additionally, the hard wire connection necessitates the use of costly, high-voltage wires to handle the large voltages being measured. The wires may also present dielectric issues because they are at the same voltage potential as the conductors. Moreover, some known circuit breakers lack the space needed for voltage attenuation and/or step-down transformers, while also maintaining sufficient dielectric strength within the insulation layer to prevent breakdown due to the high voltage levels.

BRIEF DESCRIPTION OF THE INVENTION

In one aspect, a current and voltage module is provided that includes a housing having an opening extending at least partially therethrough in an axial direction. The housing is configured to receive a conductor within the opening. The module also includes a threaded metal insert extending radially through the housing and configured to align with a threaded opening defined in the conductor. The module further includes a fastening device configured to be inserted within the threaded metal insert and into the threaded opening to electrically couple the housing to the conductor. A voltage sensor is coupled to the threaded metal insert within the housing and is configured to sense an amount of voltage in the conductor. The module also includes a current sensor within the housing configured to sense an amount of current flowing in the conductor.

In another aspect, a method of monitoring current and voltage in a conductor of a power distribution system is provided. The method includes coupling a current and voltage module to the conductor, the current and voltage module including a housing having an opening extending at least partially therethrough in an axial direction. The housing is configured to receive the conductor within the opening. The method also includes extending a threaded metal insert through the housing in a radial direction within a threaded opening defined in the conductor and inserting a fastening device through the threaded metal insert into the threaded opening to electrically couple the housing to the conductor. The method further includes sensing an amount of voltage in the conductor using a voltage sensor coupled to the threaded metal insert within the housing and sensing an amount of current flowing in the conductor using a current sensor within the housing.

In yet another aspect, a circuit protection device for use in a power distribution system is provided. The circuit protection device includes a trip mechanism configured to interrupt a current flowing through the circuit protection device. The circuit protection device also includes a current and voltage module that includes a housing having an opening extending at least partially therethrough in an axial direction. The housing is configured to receive a conductor within the opening. The module also includes a threaded metal insert extending through the housing in a radial direction and is configured to align with a threaded opening defined in the conductor. The module further includes a fastening device configured to be inserted within the threaded metal insert and into the threaded opening to electrically couple the housing to the conductor. A voltage sensor is coupled to the threaded metal insert within the housing and is configured to sense an amount of voltage in the conductor. The module also includes a current sensor within the housing configured to sense an amount of current flowing in the conductor. The circuit protection device further includes a trip unit operatively coupled to the trip mechanism and to the current and voltage module. The trip unit is configured to determine whether to activate the trip mechanism based, at least in part, on at least one of the sensed amount of voltage and the sensed amount of current.

DETAILED DESCRIPTION OF THE INVENTION

Figure 1:
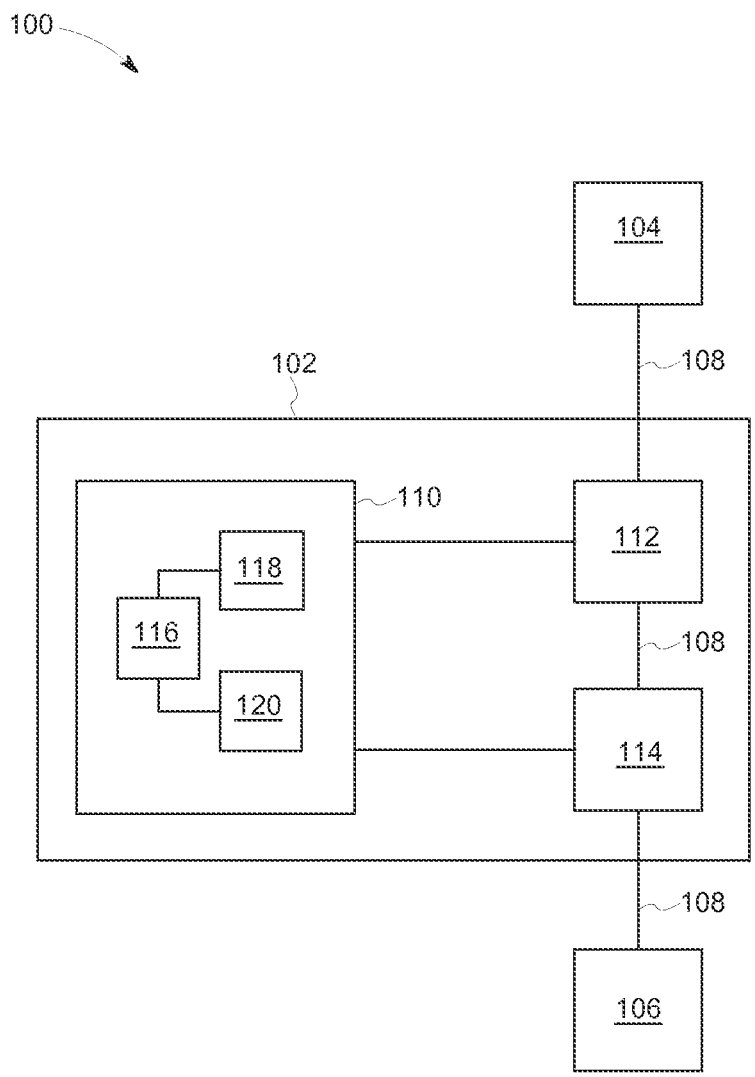
FIG. 1 is a block diagram of an exemplary power distribution system.

FIG. 1 is a schematic block diagram of a portion of an exemplary power distribution system 100 illustrating a circuit protection device 102, an electrical power source 104, and a load 106. While a single circuit protection device 102, a single electrical power source 104, and a single load 106 are illustrated within FIG. 1, it should be recognized that any suitable number of circuit protection devices 102, electrical power sources 104, and loads 106 may be included within power distribution system 100.

Electrical power source 104 may include, for example, one or more generators or other devices that provide electrical current (and resulting electrical power) to load 106. In an exemplary embodiment, the electrical current is transmitted to load 106 through one or more electrical distribution lines or busses 108 coupled to circuit protection device 102. Load 106 may include, but is not limited to only including, machinery, motors, lighting, and/or other electrical and mechanical equipment of a manufacturing or power generation or distribution facility.

Circuit protection device 102 is configured to programmably control a delivery of power from electrical power source 104 to load 106. In an exemplary embodiment, circuit protection device 102 is a circuit breaker. Alternatively, circuit protection device 102 may be any other device that enables power distribution system 100 to function as described herein. In an exemplary embodiment, circuit protection device 102 includes a controller 110 (sometimes referred to as a "trip unit") operatively coupled to a current and voltage module 112 and a trip mechanism 114. Controller 110, in an exemplary embodiment, includes a processor 116 coupled to a memory 118. In one embodiment, a display device 120 is also coupled to processor 116.

In an exemplary embodiment, current and voltage module 112 measures and generates signals representative of the measured current and/or voltage (hereinafter referred to as "current signal" and "voltage signal", respectively) flowing through a conductor (not shown in FIG. 1). Current and voltage module 112 transmits the current and/or voltage signals to processor 116. Processor 116 is programmed to activate trip mechanism 114 to interrupt a current provided to a load 106 if the current signal, and/or the current represented by the current signal, exceeds a programmable current or current-time threshold.

In an exemplary embodiment, trip mechanism 114 includes one or more circuit breaker devices and/or arc containment devices. Exemplary circuit breaker devices include, for example, circuit switches, contact arms, and/or circuit interrupters that interrupt current flowing through trip mechanism 114 to a load 106 coupled to trip mechanism 114. An exemplary arc containment device includes, for example, a containment assembly, a plurality of electrodes, a plasma gun, and a trigger circuit that causes the plasma gun to emit ablative plasma into a gap between the electrodes in order to divert energy into the containment assembly from an arc or other electrical fault that is detected on the circuit.

Processor 116 controls the operation of circuit protection device 102 and gathers measured operating condition data, such as data representative of a current measurement (also referred to herein as "current data") from a sensor 112 associated with a trip mechanism 114 coupled to processor 116. Processor 116 stores the current data in a memory 118 coupled to processor 116. It should be understood that the term "processor" refers generally to any programmable system including systems and microcontrollers, reduced instruction set circuits (RISC), application specific integrated circuits (ASIC), programmable logic circuits, and any other circuit or processor capable of executing the functions described herein. The above examples are exemplary only, and thus are not intended to limit in any way the definition and/or meaning of the term "processor."

Memory 118 stores data and/or instructions usable by processor 116 to control circuit protection device 102. In an exemplary embodiment, memory 118 includes non-volatile memory, such as flash memory and/or Electrically Erasable Programmable Read Only Memory (EEPROM). Additionally or alternatively, memory 118 may include magnetic RAM (MRAM), ferroelectric RAM (FeRAM), read only memory (ROM), and/or any other type of memory that enables circuit protection device 102 to function as described herein.

In one embodiment, display device 120 includes one or more light-emitting diodes (LEDs) that indicate a status of circuit protection device 102 and/or trip mechanism 114. For example, processor 116 may activate one or more components (e.g., LEDs) of display device 120 to indicate that circuit protection device 102 and/or trip mechanism 114 is active and/or operating normally, that a fault or failure has occurred, and/or any other status of trip mechanism 114 and/or circuit protection device 102. Additionally or alternatively, display device 120 may display an indication (using one or more LEDs, for example) of an operational parameter of circuit protection device 102 that an adjustment device is configured to control, as described more fully herein. In one embodiment, display device 120 is replaced by one or more printed stickers or labels that identify the operational parameter or parameters of circuit protection device 102 that one or more adjustment devices are configured to control.

Figure 2:
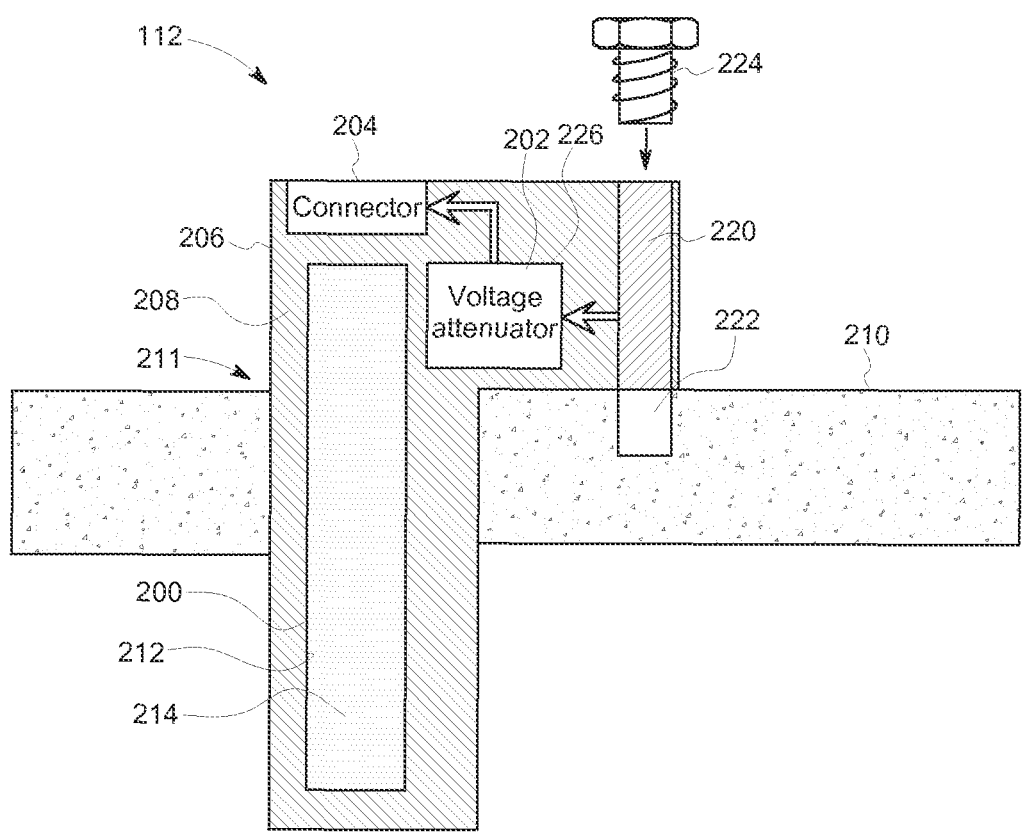
FIG. 2 is a cross-sectional view of an exemplary current and voltage module that may be used with the power distribution system shown in FIG. 1.
Figure 3:
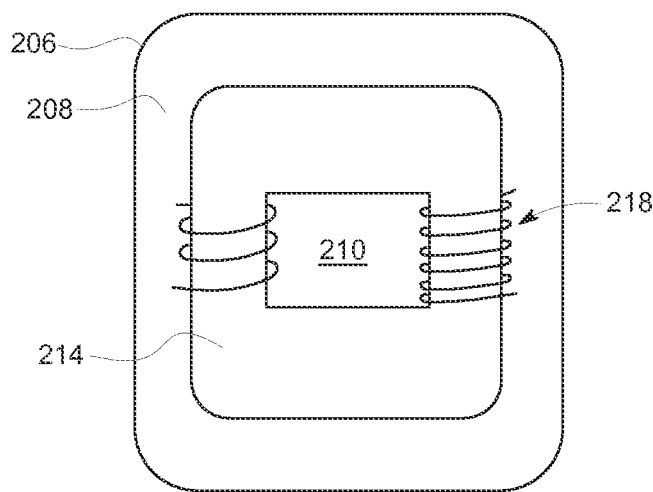
FIG. 3 is a front view of the current and voltage module shown in FIG. 2.

FIG. 2 is a cross-sectional view of an exemplary current and voltage module 112 that may be used with power distribution system 100 (shown in FIG. 1). FIG. 3 is a front view of current and voltage module 112 (shown in FIG. 2). In an exemplary embodiment, current and voltage module 112 includes a current sensor 200 and a voltage sensor 202, which are both coupled to an output connector 204. Output connector 204 is coupled to trip unit 110 (shown in FIG. 1) and enables current and voltage module 112 to transmit a current and/or voltage signal to trip unit 110 for analysis. Current and voltage module 112 also includes a housing 206 that houses the components of module 112 and an insulation layer 208 within housing 206 to provide electrical insulation for the components.

Current and voltage module 112 is coupled to a conductor 210 of power distribution system 100. Specifically, housing 206 includes an opening 211 extending at least partially therethrough in an axial direction for receiving conductor 210 within opening 211 such that housing 206 can be slid over conductor 210 for installation.

In an exemplary embodiment, current sensor 200 is a current transformer 212. In other embodiments, current sensor 200 is a Rogowski coil, a Hall-effect sensor, a shunt and/or any other known sensor capable of measuring current. Current transformer 212 generates a current signal representative of the measured or detected current flowing through conductor 210.

More specifically, current transformer 212 includes a core 214 fabricated using iron or other magnetic material. Core 214 includes a secondary winding 218. Conductor 210 forms an input of current transformer 212. Secondary winding 218 detects an amount of current flowing through conductor 210 and generates a current measurement signal. Secondary winding 218 is formed by magnet wire wrapped about core 214. Secondary winding 218 receives and scales down the current signal from the primary winding. Secondary winding 218 then transmits the scaled-down current signal to output connector 204, where it is then transmitted to trip unit 110 for analysis.

Current and voltage module 112 also includes a threaded metal insert 220 extending through housing 206 and insulation layer 208 in a radial direction. Threaded metal insert 220 is configured to align with a threaded opening 222 defined in conductor 210. When threaded metal insert 220 is aligned with threaded opening 222, a screw 224 or other similar fastening device is inserted within threaded metal insert 220 and into threaded opening 222 to secure current and voltage module 112 to conductor 210. Screw 224 electrically couples conductor 210 to threaded metal insert 220.

Current and voltage module 112 includes voltage sensor 202, which is coupled to threaded metal insert 220 and to output connector 204. In an exemplary embodiment, voltage sensor 202 is a voltage attenuator 226. In alternative embodiments, voltage sensor 202 may be a voltage divider and/or any other known sensor capable of measuring voltage. Voltage attenuator 226 is configured to measure a voltage of conductor 210 via the connection to threaded metal insert 220. More specifically, voltage attenuator 226 measures voltage in conductor 210 by measuring the voltage at the electrical connection between threaded metal insert 220 and conductor 210 formed by screw 224. Voltage attenuator 226 scales down the measured voltage and generates a voltage signal. Voltage attenuator 226 transmits the voltage signal to output connector 204, where it is then transmitted to trip unit 110 for analysis.

Figure 4:
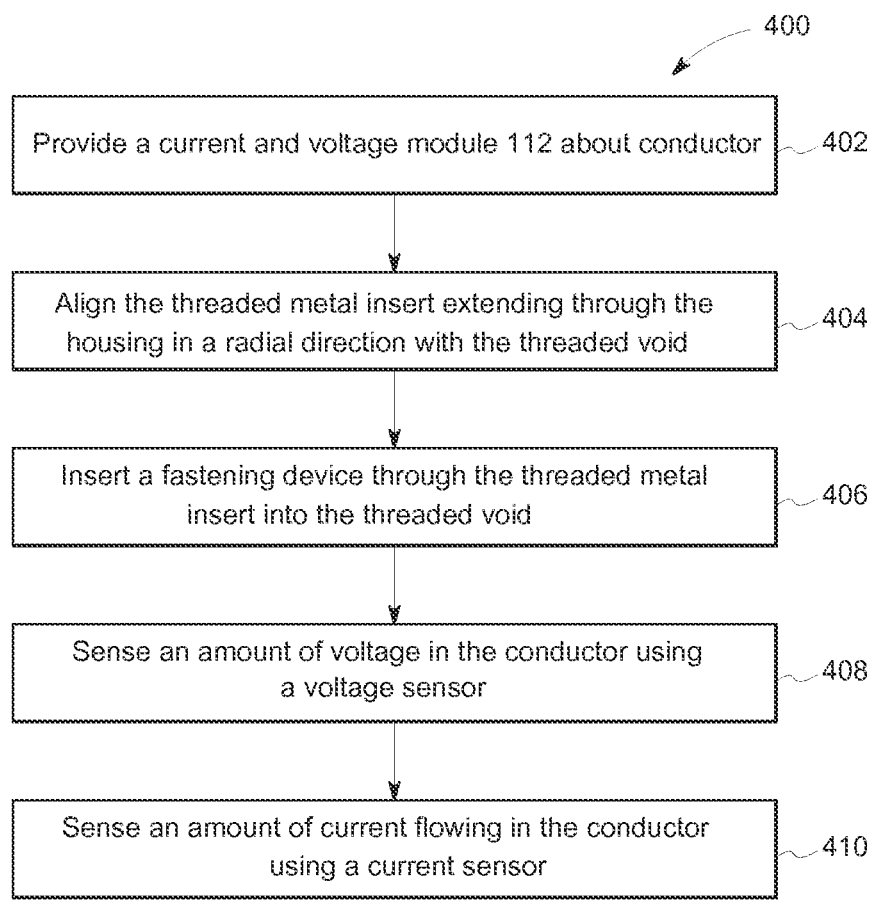
FIG. 4 is a flow diagram of an exemplary method of monitoring current and voltage in a conductor using the current and voltage module shown in FIGS. 1-3.

FIG. 4 is a flow diagram of an exemplary method 400 of monitoring current and voltage in a conductor using current and voltage module 112 (shown in FIGS. 1-3). In an exemplary embodiment, method 400 includes coupling 402 a current and voltage module 112 to conductor 210. Current and voltage module 112 includes housing 206 (shown in FIGS. 2 and 3) having opening 211 extending at least partially therethrough in an axial direction. Housing 206 is configured to receive conductor 210 within opening 211.

Method 400 also includes extending 404 threaded metal insert 220 (shown in FIG. 2) radially through housing 206 within threaded opening 222 (shown in FIG. 2) defined in conductor 210. A fastening device 224 is inserted 406 through threaded metal insert 220 into threaded opening 222 to electrically couple housing 206 to conductor 210. In an exemplary embodiment, fastening device 224 is a screw.

Method 400 further includes sensing 408 an amount of voltage in conductor 210 using voltage sensor 202 (shown in FIG. 2) coupled to threaded metal insert 220 within housing 206. In an exemplary embodiment, voltage sensor 202 is a voltage attenuator 226. In some embodiments, voltage attenuator 226 may also generate a voltage signal based on the sensed voltage, scale down the sensed voltage, and/or transmit the scaled-down voltage signal to output connector 204.

Method 400 also includes sensing 410 an amount of current flowing in conductor 210 using current sensor 200 (shown in FIG. 2). In an exemplary embodiment, current sensor 200 is a current transformer 212 (shown in FIGS. 2 and 3). Current transformer includes primary winding 216 (shown in FIG. 3) that is configured to measure an amount of current flowing in conductor 210 and generate a current signal based on the current measurement. Current transformer also includes secondary winding 218 (shown in FIG. 3) that is configured to scale down the current signal and transmit the scaled-down current signal to output connector 204.

As compared to at least some known current and voltage sensing devices used in circuit protection devices, the systems and methods described herein facilitate sensing voltage in a circuit breaker without the use of taps molded in the breaker housing or external high-voltage wiring connecting the taps to the circuit breaker trip unit. Rather, the current and voltage module described herein uses a voltage attenuator that is insulated within a current transformer housing to internally scale down the voltage before sending the voltage signal to the trip unit. Further the current and voltage module described herein integrates the voltage attenuator and the current transformer into the same module. The module utilizes a single output connector for communicating voltage and current measurements to the trip unit.

A technical effect of the methods and systems described herein may include one or more of: (a) coupling a current and voltage module to the conductor, the current and voltage module including a housing having an opening extending at least partially therethrough in an axial direction, the housing configured to receive the conductor within the opening; (b) extending a threaded metal insert extending radially through the housing within a threaded opening defined in the conductor; (c) inserting a fastening device through the threaded metal insert and into the threaded opening to electrically couple the housing to the conductor (d) sensing an amount of voltage in the conductor using a voltage sensor coupled to the threaded metal insert within the housing; and (e) sensing an amount of current flowing in the conductor using a current sensor within said housing.

Exemplary embodiments of a current and voltage module and methods of monitoring current and voltage in a conductor of a power distribution unit are described above in detail. The current and voltage module and methods are not limited to the specific embodiments described herein but, rather, components of the current and voltage module and/or operations of the methods may be utilized independently and separately from other components and/or operations described herein. Further, the described components and/or operations may also be defined in, or used in combination with, other systems, methods, and/or devices, and are not limited to practice with only the power distribution system as described herein.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A current and voltage module comprising:
 a housing having an opening extending at least partially therethrough in an axial direction, said housing configured to receive a conductor within the opening;
 a threaded metal insert extending through said housing in a radial direction, said threaded metal insert comprising a hollow cylindrical body and threads defined on an inner surface of said hollow cylindrical body, said threaded metal insert configured to align with a threaded opening defined in the conductor;
 a fastening device configured to be inserted within said threaded metal insert and into the threaded opening of the conductor to form an electrically conductive path from the conductor to said threaded metal insert via said fastening device, and to secure said housing to the conductor;
a voltage sensor coupled to said threaded metal insert within said housing, said voltage sensor configured to sense an amount of voltage in the conductor; and
a current sensor within said housing, said current sensor configured to sense an amount of current flowing in the conductor.

2. A current and voltage module in accordance with claim 1, further comprising an output connector within said housing, said output connector communicatively coupled to a circuit breaker trip mechanism.

3. A current and voltage module in accordance with claim 2, wherein said output connector is coupled to said voltage sensor, said voltage sensor configured to generate a voltage signal based on the sensed voltage and transmit the voltage signal to said output connector.

4. A current and voltage module in accordance with claim 2, wherein said output connector is coupled to said current sensor, said current sensor configured to generate a current signal based on the sensed current and transmit the current signal to said output connector.

5. A current and voltage module in accordance with claim 1, wherein said current sensor comprises a current transformer.

6. A current and voltage module in accordance with claim 5, wherein said current transformer comprises:
a primary winding configured to measure an amount of current flowing in the conductor and generate a current signal based on the measurement; and
a secondary winding configured to scale down the current signal received from said primary winding.

7. A current and voltage module in accordance with claim 6, further comprising an output connector coupled to said secondary winding within said housing, wherein said secondary winding is further configured to transmit the scaled-down current signal to said output connector.

8. A current and voltage module in accordance with claim 1, wherein said current sensor comprises one of a Rogowski coil, a Hall-effect sensor, and a shunt.

9. A current and voltage module in accordance with claim 1, wherein said voltage sensor comprises a voltage attenuator configured to:
generate a voltage signal based on the sensed amount of voltage;
scale down the voltage signal; and
transmit the voltage signal to an output connector within said housing, said output connector communicatively coupled to a circuit breaker trip unit.

10. A current and voltage module in accordance with claim 1, further comprising an insulation layer within said housing.

11. A current and voltage module in accordance with claim 1, wherein said fastening device comprises a screw.

12. A method of monitoring current and voltage in a conductor of a power distribution system, said method comprising:
coupling a current and voltage module to the conductor, the current and voltage module including a housing having an opening extending at least partially therethrough in an axial direction, the housing configured to receive the conductor within the opening;
extending a threaded metal insert radially through the housing within a threaded opening defined in the conductor, the threaded metal insert including a hollow cylindrical body and threads defined on an inner surface of the hollow cylindrical body;
inserting a fastening device through the threaded metal insert into the threaded opening of the conductor to form an electrically conductive path from the conductor to the threaded metal insert via the fastening device, and to secure the housing to the conductor;
sensing an amount of voltage in the conductor using a voltage sensor coupled to the threaded metal insert within the housing; and
sensing an amount of current flowing in the conductor using a current sensor within the housing.

13. A method in accordance with claim 12, wherein sensing an amount of voltage in the conductor using a voltage sensor comprises sensing the amount of voltage in the conductor using a voltage attenuator coupled to the threaded metal insert.

14. A method in accordance with claim 13, further comprising:
generating a voltage signal based on the sensed voltage, the voltage signal generated by the voltage attenuator;
scaling down the sensed voltage by the voltage attenuator; and
transmitting the scaled-down voltage signal to an output connector within the housing, the output connector communicatively coupled to a circuit breaker trip unit.

15. A method in accordance with claim 12, wherein sensing an amount of current flowing in the conductor using a current sensor comprises sensing the amount of current flowing in the conductor using a current transformer.

16. A method in accordance with claim 15, further comprising:
generating a current signal based on the sensed current, the current signal generated by the current transformer; and
transmitting the current signal to an output connector within the housing, the output connector communicatively coupled to a circuit breaker trip unit.

17. A method in accordance with claim 15, wherein the current transformer includes a primary winding and a secondary winding, said method further comprising:
measuring an amount of current flowing in the conductor using the primary winding;
generating a current signal based on the current measurement;
scaling down the current signal by the secondary winding; and
transmitting the scaled-down current signal to an output connector within the housing, the output connector communicatively coupled to a circuit breaker trip unit.

18. A circuit protection device for a power distribution system, said circuit protection device comprising:
a trip mechanism configured to interrupt a current flowing through said circuit protection device;
a current and voltage module comprising:
a housing having an opening extending at least partially therethrough in an axial direction, said housing configured to receive a conductor within the opening;
a threaded metal insert extending through said housing in a radial direction, said threaded metal insert comprising a hollow cylindrical body and threads defined on an inner surface of said hollow cylindrical body, said threaded metal insert configured to align with a threaded opening defined in the conductor;
a fastening device configured to be inserted within said threaded metal insert and into the threaded opening of the conductor to form an electrically conductive path from the conductor to said threaded metal insert via said fastening device, and to secure said housing to the conductor;

a voltage sensor coupled to said threaded metal insert within said housing, said voltage sensor configured to sense an amount of voltage in the conductor; and a current sensor within said housing, said current sensor configured to sense an amount of current flowing in the conductor; and a trip unit operatively coupled to said trip mechanism and to said current and voltage module, said trip unit configured to determine whether to activate said trip mechanism based, at least in part, on at least one of the sensed amount of voltage and the sensed amount of current.

19. A circuit protection device in accordance with claim 18, wherein said voltage sensor comprises a voltage attenuator configured to:

generate a voltage signal based on the sensed amount of voltage;

scale down the voltage signal; and transmit the voltage signal to an output connector within said housing, said output connector communicatively coupled to a circuit breaker trip unit.

20. A circuit protection device in accordance with claim 18, wherein said voltage sensor comprises a current transformer comprising:

a primary winding configured to measure an amount of current flowing in the conductor and generate a current signal based on the measurement; and a secondary winding configured to scale down the current signal received from said primary winding and transmit the current signal to an output connector within said housing, said output connector communicatively coupled to a circuit breaker trip unit.

* * * * *